(12) United States Patent
Nakabayashi et al.

(10) Patent No.: US 12,334,339 B2
(45) Date of Patent: Jun. 17, 2025

(54) MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMAMATSU PHOTONICS K.K., Hamamatsu (JP)

(72) Inventors: Shosuke Nakabayashi, Nisshin (JP); Masatake Nagaya, Nisshin (JP); Chiaki Sasaoka, Nagoya (JP); Shoichi Onda, Nagoya (JP); Jun Kojima, Nagoya (JP); Daisuke Kawaguchi, Hamamatsu (JP); Ryuji Sugiura, Hamamatsu (JP); Toshiki Yui, Hamamatsu (JP); Keisuke Hara, Hamamatsu (JP); Tomomi Aratani, Hamamatsu (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); National University Corporation Tokai National Higher Education and Research System, Nagoya (JP); HAMAMATSU PHOTONICS K.K., Hamamatsu (JP)

( * ) Notice: Subject to any disclaimer, the term of this patent is extended or adjusted under 35 U.S.C. 154(b) by 146 days.

(21) Appl. No.: 18/188,821

(22) Filed: Mar. 23, 2023

(65) Prior Publication Data
US 2023/0326748 A1    Oct. 12, 2023

(30) Foreign Application Priority Data
Apr. 7, 2022 (JP) .................. 2022-063947

(51) Int. Cl.
*H01L 21/02* (2006.01)
*H01L 21/268* (2006.01)
*H01L 21/304* (2006.01)

(52) U.S. Cl.
CPC ...... *H01L 21/02389* (2013.01); *H01L 21/268* (2013.01); *H01L 21/304* (2013.01)

(58) Field of Classification Search
CPC .......... H01L 21/02389; H01L 21/268; H01L 21/304; H01L 21/28; H01L 21/428; H01L 21/44; H01L 21/463; H01L 21/78–86
See application file for complete search history.

(56) References Cited

U.S. PATENT DOCUMENTS

| 5,155,574 A | 10/1992 | Yamaguchi |
| 2007/0138540 A1* | 6/2007 | Uemura ............. H01L 33/405 |
| | | 257/E33.068 |

(Continued)

FOREIGN PATENT DOCUMENTS

| JP | 2009-224641 A | 10/2009 |
| JP | 2013-239600 A | 11/2013 |

(Continued)

OTHER PUBLICATIONS

Virko, M. V., et al., "On the Laser Detachment of n-GaN Films from Substrates, Based on the Strong Absorption of IR Light by Free Charge Carriers in n+-GaN Substrates", Semiconductors 50 (5), pp. 699-704 (Year: 2016).*

(Continued)

*Primary Examiner* — Peter Bradford
*Assistant Examiner* — Ryan T. Fortin
(74) *Attorney, Agent, or Firm* — Posz Law Group, PLC

(57) ABSTRACT

A manufacturing method of a semiconductor device, includes: forming a gas vent recess in a first surface of a compound semiconductor substrate, which includes a plurality of device regions adjacent to the first surface, along an interface between the plurality of device regions; forming an altered layer inside the compound semiconductor substrate to extend along the first surface at a depth corresponding to a range of a depth of the gas vent recess by applying a laser beam; dividing the compound semiconductor substrate at the altered layer into a first part including the first surface and a second part including a second surface of the compound (Continued)

semiconductor substrate opposite to the first surface; and forming a metal film to cover a divided surface of the first part while exposing the gas vent recess.

9 Claims, 9 Drawing Sheets

(56) References Cited

U.S. PATENT DOCUMENTS

| | | | |
|---|---|---|---|
| 2011/0159615 A1* | 6/2011 | Lai | H01L 33/0093 |
| | | | 257/E21.211 |
| 2011/0263058 A1* | 10/2011 | Yamae | H01L 33/0095 |
| | | | 438/33 |
| 2021/0327702 A1 | 10/2021 | Kojima et al. | |

FOREIGN PATENT DOCUMENTS

| | | | |
|---|---|---|---|
| JP | 2017-132927 A | 8/2017 | |
| JP | 2018-200978 A | 12/2018 | |
| JP | 2020-102520 A | 7/2020 | |
| WO | WO 2014/027380 A1 * | 2/2014 | ............. H01L 33/32 |

OTHER PUBLICATIONS

Voronenkov, Vladislav, et al., "Laser slicing: A thin film lift-off method for GaN-on-GaN technology", Results in Physics 13, pp. 102233-1-102233-4 (Year: 2019).*

Renfu Zhang et al "Ultra Wafer Thinning and Dicing Technology for Stacked Die Packages", IEEE, 2016.

* cited by examiner

MANUFACTURING METHOD OF SEMICONDUCTOR DEVICE

CROSS REFERENCE TO RELATED APPLICATION

The present application claims the benefit of priority from Japanese Patent Application No. 2022-063947 filed on Apr. 7, 2022. The entire disclosures of the above application are incorporated herein by reference.

TECHNICAL FIELD

The present disclosure relates to a manufacturing method of a semiconductor device.

BACKGROUND

For example, in a method for manufacturing a semiconductor device, it is known to form an altered layer inside a compound semiconductor substrate by irradiating the compound semiconductor substrate with a laser beam. The altered layer is formed to extend along the surface of the compound semiconductor substrate. By forming the altered layer in this way, the compound semiconductor substrate can be processed. For example, the compound semiconductor substrate can be divided at the altered layer, so a thinner compound semiconductor substrate can be obtained.

SUMMARY

The present disclosure describes a manufacturing method of a semiconductor device. According to an aspect of the present disclosure, a manufacturing method of a semiconductor device includes: forming a gas vent recess in a first surface of a compound semiconductor substrate, which includes a plurality of device regions adjacent to the first surface, along an interface between the plurality of device regions; forming an altered layer inside the compound semiconductor substrate to extend along the first surface at a depth corresponding to a range of a depth of the gas vent recess by applying a laser beam; dividing the compound semiconductor substrate at the altered layer into a first part including the first surface and a second part including a second surface of the compound semiconductor substrate opposite to the first surface; and forming a metal film to cover a divided surface of the first part opposite to the first surface while exposing the gas vent recess.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1:
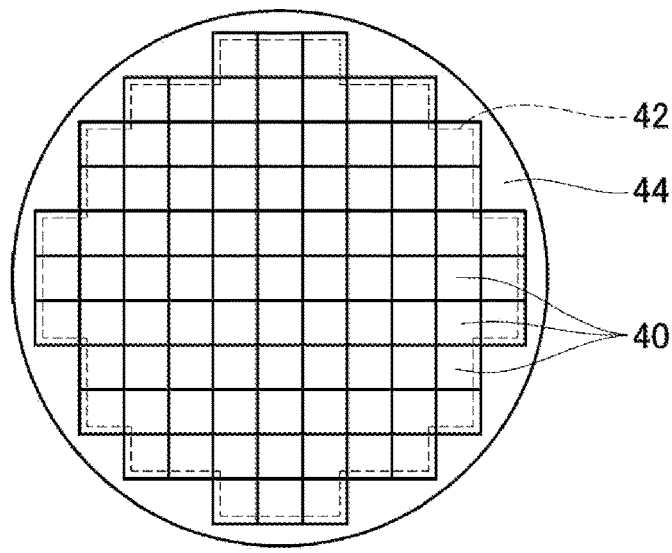
FIG. 1 is a plan view of a gallium nitride (GaN) substrate.

In a manufacturing method of a semiconductor device, when an altered layer is formed inside a compound semiconductor substrate by irradiating the compound semiconductor substrate with a laser beam, gas is generated at the altered layer. Pressure of the generated gas may cause cracks in an unintended direction in the compound semiconductor substrate. In order to avoid such cracks, a gas vent portion may be formed in a first surface of the compound semiconductor substrate to reach a depth where the altered layer is to be formed, before the altered layer is formed. Here, a part of the compound semiconductor substrate including the first surface and after being divided at the altered layer is referred to as a first part of the compound semiconductor substrate. Also, a situation is assumed in which a metal film for serving as an electrode or the like is formed on a divided surface of the first part of the compound semiconductor substrate, after the compound semiconductor substrate is divided at the altered layer. In such a situation, since the gas vent portion extends to the depth reaching the altered layer from the first surface, the divided surface of the first part has a recess provided by the gas vent portion. Therefore, when the metal film is formed on the divided surface, the metal film is formed across the divided surface as well as the inside of the gas vent portion. When the first part is diced into pieces, that is, into semiconductor devices along the gas vent portion, the respective semiconductor devices are likely to be stressed by the metal film formed inside the gas vent portion, resulting cracks in the semiconductor devices.

The present disclosure provides a technique of manufacturing a semiconductor device with enhanced yield.

In an embodiment of the present disclosure, a manufacturing method of a semiconductor device includes: forming a gas vent recess in a first surface of a compound semiconductor substrate, which includes a plurality of device regions adjacent to the first surface, along an interface between the plurality of device regions; forming an altered layer inside the compound semiconductor substrate to extend along the first surface at a depth corresponding to a range of a depth of the gas vent recess by applying a laser beam; dividing the compound semiconductor substrate at the altered layer into a first part including the first surface and a second part including a second surface of the compound semiconductor substrate opposite to the first surface; and forming a metal film to cover a divided surface of the first part opposite to the first surface while exposing the gas vent recess.

In such a method, after the compound semiconductor substrate is divided into the first part and the second part at the altered layer, the metal film is formed to cover the divided surface of the first part. Therefore, when the first part is diced into semiconductor devices along the gas vent recess, it is less likely that the respective semiconductor devices will receive stress due to the metal film. Therefore, it is less likely that cracks will be generated in the semiconductor devices. Accordingly, the semiconductor devices can be manufactured with enhanced yield.

In an embodiment of the present disclosure, in the manufacturing method, the forming of the metal film may include: forming a resist to cover an inner surface of the gas vent recess and a peripheral portion of the gas vent recess on the divided surface, the resist having a first thickness at the peripheral portion; arranging the metal film to cover the divided surface and the resist, the metal film having a second thickness smaller than the first thickness of the resist; and, after the arranging of the metal film having the second thickness, removing the resist.

In such a configuration, since the second thickness of the metal film is smaller than the first thickness of the resist formed at the peripheral portion of the gas vent recess, the metal film covering the upper surface of the resist can be separated from the metal film covering the divided surface. Therefore, the metal film formed on the upper surface of the resist can be removed together with the resist, and it is possible to restrict the metal film from being formed inside the gas vent recess. Also, the resist can be formed with high accuracy. Accordingly, semiconductor devices can be manufactured and reduced in variations.

In an embodiment of the present disclosure, in the manufacturing method, the forming of the metal film may include: arranging a mask to cover the gas vent recess and a peripheral portion of the gas vent recess on the divided surface, the mask having a third thickness; arranging the metal film to cover the divided surface and the mask, the metal film having a fourth thickness smaller than the third thickness of the mask; and, after the arranging of the metal film having the fourth thickness, removing the mask.

In such a configuration, since the fourth thickness of the metal film is smaller than the third thickness of the mask at the peripheral portion of the gas vent hole, the metal film covering the upper surface of the mask is separated from the metal film covering the divided surface. Therefore, the metal film formed on the upper surface of the mask can be removed together with the mask, and it is possible to restrict the metal film from being formed inside the gas vent recess. In addition, since the mask is only positioned and arranged so as to cover the gas vent recess and the peripheral portion of the gas vent recess, it is possible to physically remove the mask. Accordingly, the semiconductor device can be manufactured regardless of the material of the metal film.

In an embodiment of the present disclosure, in the manufacturing method, the forming of the metal film may include: arranging the metal film to cover the divided surface and the gas vent recess; forming a resist on a surface of the metal film, the resist defining an opening above the gas vent recess and a peripheral portion of the gas vent recess; and removing the metal film from the inside of the gas vent recess through the resist.

In such a configuration, after the metal film is formed entirely on the divided surface and the inside of the gas vent recess, the metal film inside the gas vent recess is removed through the resist, so the gas vent recess is exposed. Also, the resist can be formed with high accuracy. Therefore, the semiconductor devices can be manufactured and reduced in variations.

In an embodiment of the present disclosure, in the manufacturing method, the compound semiconductor substrate may be made of gallium nitride or gallium oxide.

Embodiments of the present disclosure will be described in detail with reference to the drawings.

First Embodiment

Figure 2:
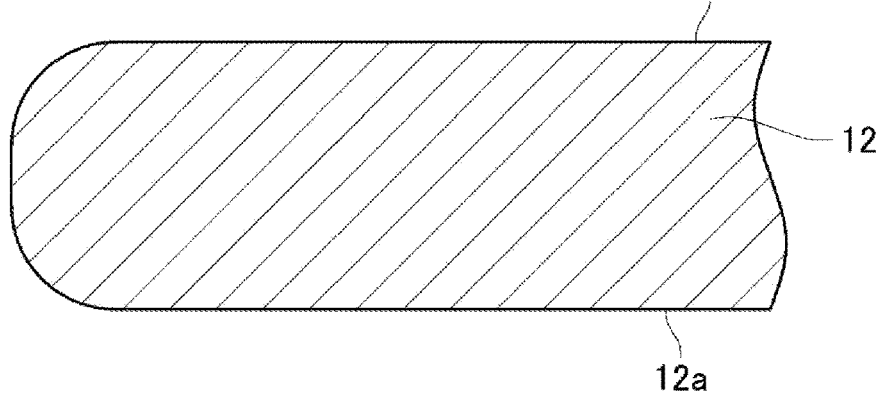
FIG. 2 is a cross-sectional view of the GaN substrate.

In a manufacturing method of a first embodiment, a semiconductor device is manufactured from a gallium nitride substrate 12 (hereinafter referred to as GaN substrate 12) shown in FIGS. 1 and 2. As shown in FIG. 1, the GaN substrate 12 has a central region 42 and a peripheral region 44. The central region 42 includes a plurality of device regions 40. In the central region 42, the device regions 40 are arranged in a matrix. Although not shown, each device region 40 is formed with a device structure in a range facing a first surface 12a of the GaN substrate 12. The device structure formed in each device region 40 may be a metal oxide semiconductor field effect transistor (MOSFET), an insulated gate bipolar transistor (IGBT), a diode, or the like. The peripheral region 44 is located on a periphery of the central region 42. The peripheral region 44 is the region of the GaN substrate 12 excluding the central region 42. The GaN substrate 12 has optical transparency.

<Gas Vent Recess Forming Process>

Figure 3:
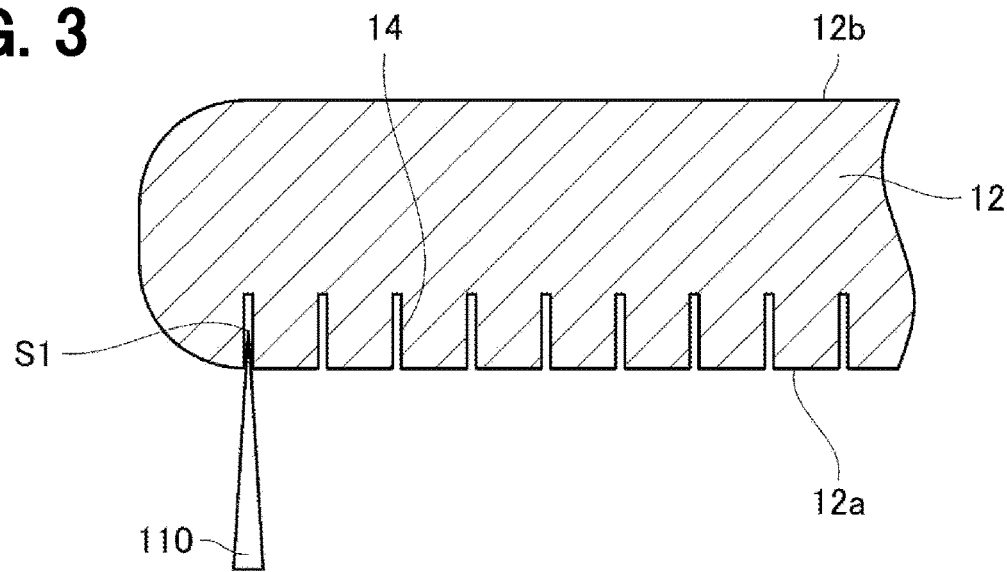
FIG. 3 is a cross-sectional view for explaining a process of forming a gas vent recess.
Figure 4:
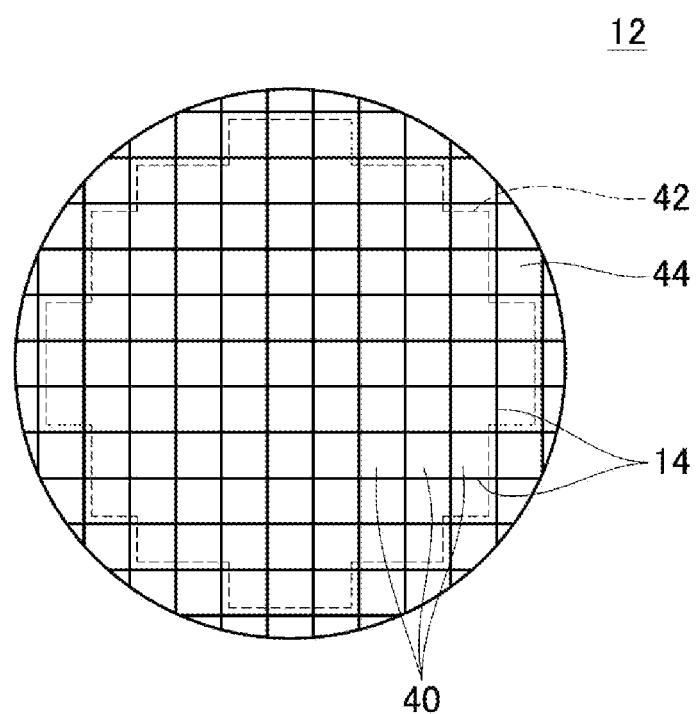
FIG. 4 is a plan view of the GaN substrate in which a gas vent recess has been formed.

When manufacturing a semiconductor device from the GaN substrate 12, first, a gas vent recess forming process is performed. In the gas vent recess forming process, a gas vent groove 14 is formed in the first surface 12a of the GaN substrate 12. In this example, as shown in FIG. 3, the GaN substrate 12 is irradiated with a laser beam 110 from the first surface 12a side. The laser beam 110 is applied so as to have a focal point 51 within the GaN substrate 12. The gas vent groove 14 is formed at a position irradiated with the laser beam 110. In this example, by moving the irradiation position of the laser beam 110, as shown in FIG. 4, the gas vent groove 14 is formed along an interface between the device regions 40. Moreover, the gas vent groove 14 is formed also in the outer peripheral region 44. In the outer peripheral region 44, the gas vent groove 14 is formed on an extension of the interface of the device regions 40. That is, in this example, as shown in FIG. 4, the gas vent groove 14 is formed so as to partition the entire first surface 12a of the GaN substrate 12 in a grid pattern. In the gas vent recess forming process, the gas vent groove 14 may be formed in the first surface 12a of the GaN substrate 12 by applying the laser beam 110 from the second surface 12b side of the GaN substrate 12.

<Modified Layer Forming Process>

Figure 5:
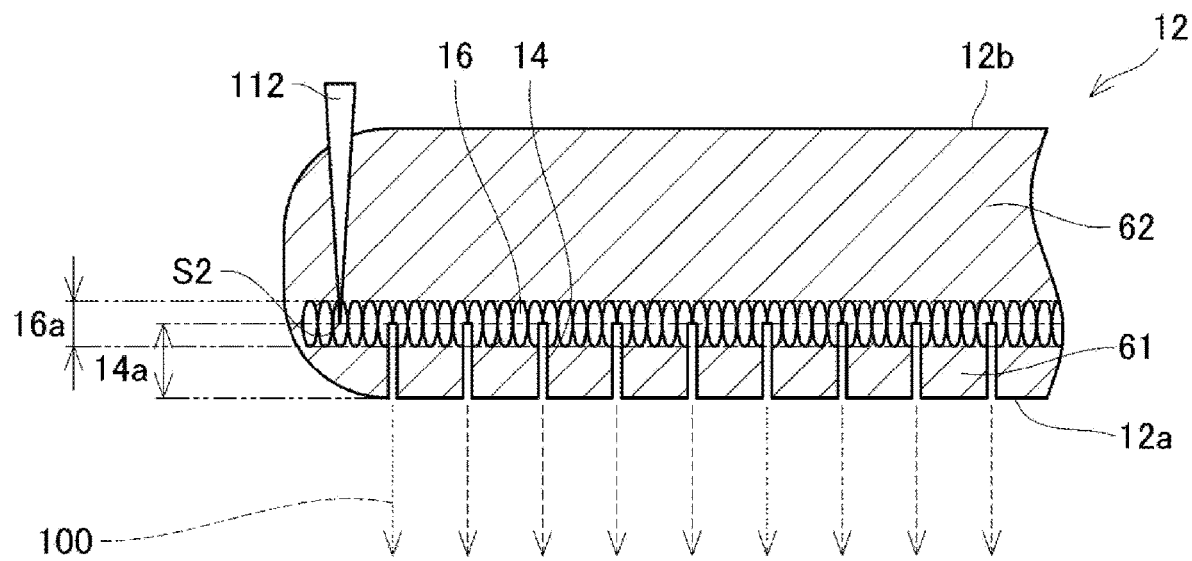
FIG. 5 is a cross-sectional view for explaining a process of forming an altered layer.

Next, an altered layer forming process to form an altered layer 16 inside the GaN substrate 12 is performed. In the altered layer forming process, as shown in FIG. 5, a laser beam 112 is applied to the GaN substrate 12 from the second surface 12b side. The laser beam 112 is applied so as to have a focal point S2 inside the GaN substrate 12. At the focal point S2, gallium nitride (GaN) is heated and decomposed. As a result, an altered layer 16 composed of a precipitated layer of gallium or the like is formed at the position of the focal point S2. The strength of the altered layer 16 is lower than that of the original gallium nitride single crystal. Therefore, the strength of the altered layer 16 is lower than that of gallium nitride single crystal on a periphery of the altered layer 16. In this example, by moving the irradiation position with the laser beam 112 along a direction parallel to the first surface 12a and the second surface 12b of the GaN substrate 12, the altered layer 16 is formed to extend at a predetermined depth and along the first surface 12a and the second surface 12b. In addition, in this example, the altered layer 16 is formed so that the altered layer 16 and the gas vent groove 14 overlap in a depth range. In other words, the altered layer 16 is formed such that a range 16a of the altered layer 16 in a thickness direction of the GaN substrate 12 and a range 14a of the gas vent groove 14 in the thickness direction of the GaN substrate 12 overlap each other. In this example, the altered layer 16 is formed entirely in the GaN substrate 12 in a lateral direction, that is, in a direction parallel to the first surface 12a and the second surface 12b of the GaN substrate 12. Hereinafter, a part of the GaN substrate 12 closer to the first surface 12a than the altered layer 16, that is, a part between the altered layer 16 and the first surface 12a is referred to as a first part 61. Also, a part of the GaN substrate 12 closer to the second surface 12b than the altered layer 16, that is, a part between the altered layer 16 and the second surface 12b is referred to as a second part 62.

When the GaN substrate 12 is irradiated with the laser beam 112 to decompose GaN, that is, when the altered layer 16 is formed, nitrogen gas (i.e., $N_2$ gas) is generated. As described above, the altered layer 16 is formed in the depth range that overlaps with the gas vent groove 14. Therefore, as indicated by arrows 100 in FIG. 6, the nitrogen gas generated at the formation position of the altered layer 16 is discharged to the outside of the GaN substrate 12 through the gas vent groove 14. This restricts an increase in pressure of the nitrogen gas inside the GaN substrate 12. As such, an occurrence of cracks inside the GaN substrate 12 due to the pressure of the nitrogen gas is suppressed.

<Support Member Attaching Process>

Figure 6:
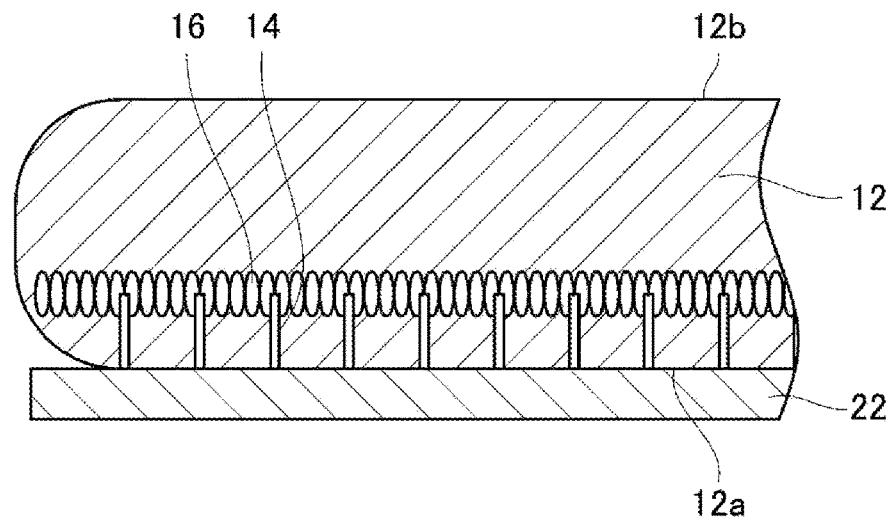
FIG. 6 is a cross-sectional view for explaining a process of attaching a support member.

Next, a support member attaching process is performed. In the support member attaching process, as shown in FIG. 6, a support member 22 is attached to the first surface 12a of the GaN substrate 12. The support member 22 may be a hard plate material or a flexible sheet-like member. The support member 22 restricts damage to the first surface 12a of the GaN substrate 12, such as the first surface 12a being scratched, in subsequent processes. The support member 22 may be attached to the GaN substrate 12 before the gas vent recess forming process, or may be attached to the GaN substrate 12 before the altered layer forming process. In this case, the support member 22 preferably has optical transparency for irradiating the GaN substrate 12 with the laser beam 110. Also, the support member 22 preferably has air permeability for discharging the nitrogen gas generated in the altered layer forming process.

<Dividing Process>

Figure 7:
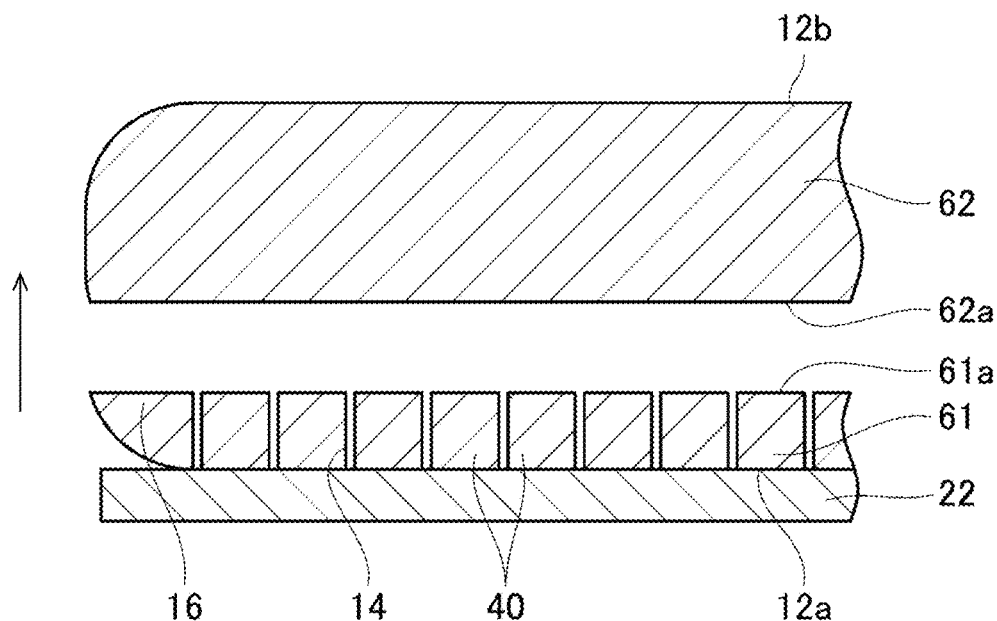
FIG. 7 is a cross-sectional view for explaining a process of dividing the GaN substrate.

Next, as shown in FIG. 7, a force is applied to the second part 62 in a direction to separate from the first part 61, so that the GaN substrate 12 is divided at the altered layer 16. That is, the second part 62 is separated from the first part 61. As described above, since the strength of the altered layer 16 is lower than that of gallium nitride single crystal, the GaN substrate 12 can be divided at the altered layer 16. Thereafter, an upper surface 61a of the first part 61, that is, a divided surface 61a of the first part 61 opposite to the first surface 12a is polished and cleaned as necessary. In the first part 61, the gas vent groove 14 passing therethrough from the first surface 12a to the divided surface 61a has been formed in a grid pattern. Therefore, the first part 61 is in a state of being divided into the multiple device regions 40. Since the respective device regions 40 are supported by the support member 22, the respective device regions 40 are fixed on the support member 22.

<Electrode Forming Process>

Figure 8:
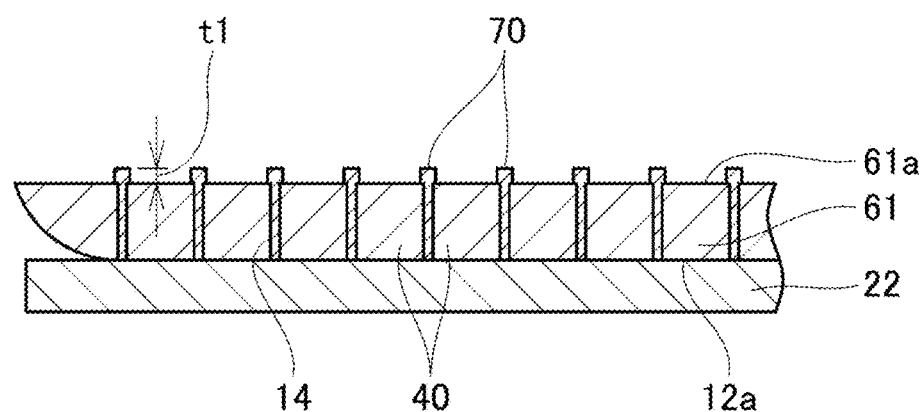
FIG. 8 is a cross-sectional view for explaining a process of forming an electrode in a first embodiment.
Figure 9:
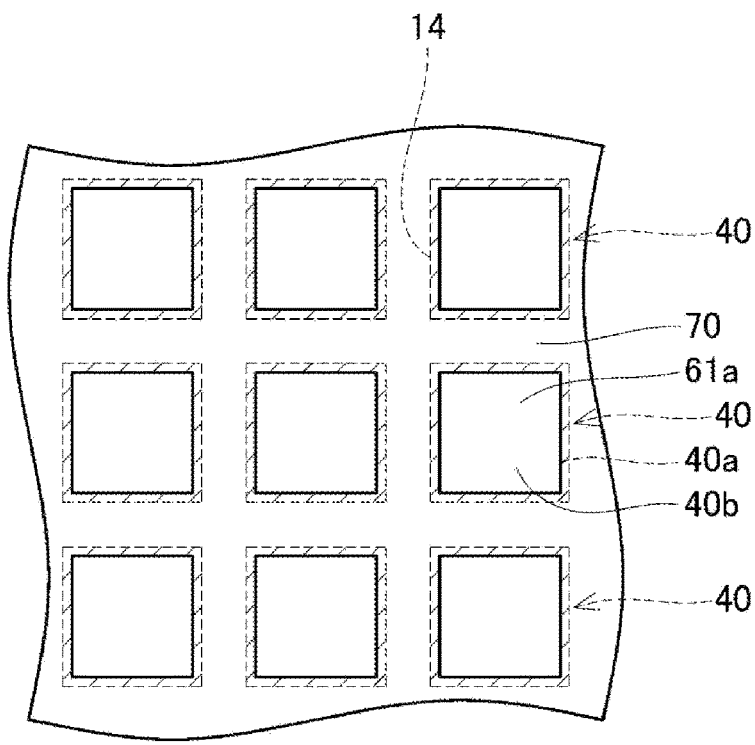
FIG. 9 is a plan view for explaining the process of forming the electrode in the first embodiment.

Next, an electrode forming process is performed. First, a resist solution is applied to the divided surface 61a of the first part 61 and the inside of the gas vent groove 14, and then exposed and developed. Thus, as shown in FIG. 8, a resist 70 is selectively formed relative to the first part 61. In this example, as shown in FIG. 9, the resist 70 is formed so as to cover the inside of the gas vent groove 14 and a peripheral portion 40a of the gas vent groove 14 on the divided surface 61a, that is, a peripheral edge portion 40a of each device region 40. The resist 70 is not formed at a central portion 40b of each device region 40 on the divided surface 61a. Further, as shown in FIG. 8, the resist 70 is formed so that the thickness of the resist 70 at the peripheral portion 40a, that is, the height from the divided surface 61a to the upper surface of the resist 70 is a first thickness t1.

Figure 10:
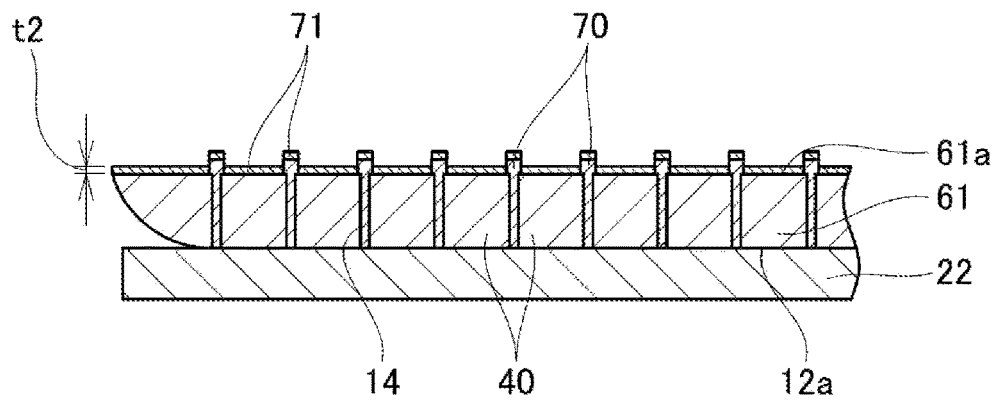
FIG. 10 is a cross-sectional view for explaining the process of forming the electrode in the first embodiment.

Next, as shown in FIG. 10, a metal film 71 is formed to cover the divided surface 61a and the resist 70. The metal film 71 can be formed by a known method such as sputtering or vapor deposition. In this example, the metal film 71 is formed to have a second thickness t2 that is smaller than the first thickness t1 of the resist 70. Since the second thickness t2 is smaller than the first thickness t1, the metal film 71 formed on the upper surface of the resist 70 is separated from the metal film 71 formed on the divided surface 61a.

Figure 11:
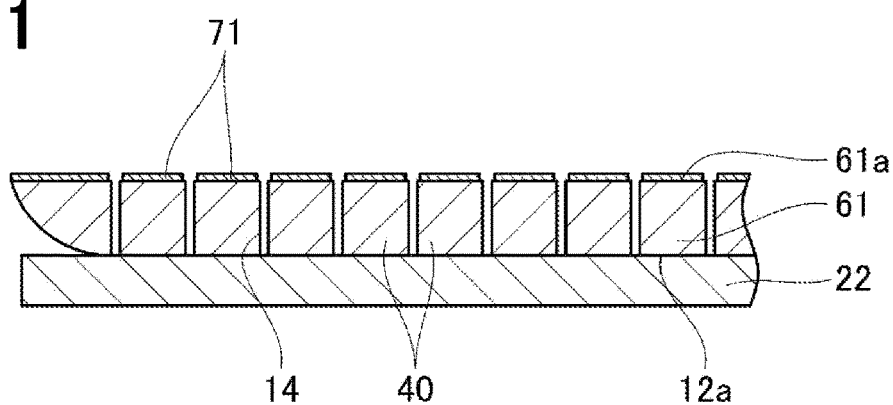
FIG. 11 is a cross-sectional view for explaining the process of forming the electrode in the first embodiment.

Next, as shown in FIG. 11, the resist 70 is removed. Since the metal film 71 formed on the upper surface of the resist 70 is separated from the metal film 71 formed on the divided surface 61a, the metal film 71 remains on the divided surface 61a when the resist 70 is removed. Each metal film 71 remaining on the divided surface 61a serves as an electrode of the semiconductor device.

Next, the support member 22 is separated from the first part 61, so the multiple device regions 40 in which electrodes (metal films 71) have been formed can be obtained. Thereafter, an insulating layer, an electrode, and the like are formed on the first surface 12a of each device region 40. In this way, the multiple semiconductor devices are produced.

Figure 12:
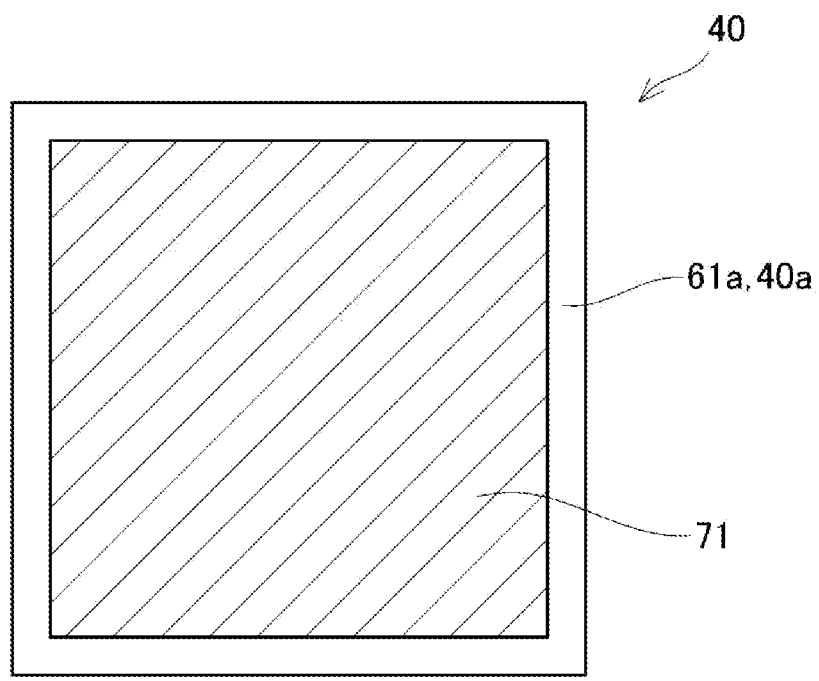
FIG. 12 is a plan view of a semiconductor substrate manufactured by a manufacturing method in the first embodiment, when viewed from the bottom.

In the present embodiment, the resist 70 is formed so as to cover the gas vent groove 14 and the peripheral portion 40a in the electrode forming process. Therefore, the metal film 71 is not formed over the entire divided surface 61a. That is, as shown in FIG. 12, in the produced semiconductor device, a part of the divided surface 61a (that is, the peripheral edge portion 40a) is in an exposed state.

Note that the second part 62 may be reused for manufacturing semiconductor devices thereafter. For example, the divided surface 62a (see FIG. 7) of the second part 62 is polished, etched, and the like, and then a GaN layer is epitaxially grown on the divided surface 62a. Thus, the thickness of the second part 62 can be increased to the original thickness of the GaN substrate 12. The second part 62 which has been increased in thickness can be reused as the GaN substrate 12 to manufacture semiconductor devices.

In the manufacturing method of the first embodiment, the second thickness t2 of the metal film 71 is smaller than the first thickness t1 of the resist 70 formed in the peripheral portion 40a of the gas vent groove 14. Thus, the metal film 71 covering the upper surface of the resist 70 can be separated from the metal film 71 covering the divided surface 61a. Therefore, the metal film 71 formed on the upper surface of the resist 70 can be removed together with the resist 70, which is so-called "lift-off". As such, it is possible to suppress the metal film 71 from being formed inside the gas vent groove 14. Since the metal film 71 is not formed inside the gas vent groove 14 provided along the interface between the respective device regions 40, it is less likely that the device regions 40 will receive stress due to the metal film 71, when the device regions 40 are removed by peeling the support member 22. Therefore, cracks are less likely to occur in the manufactured semiconductor device. Accordingly, the semiconductor device can be manufactured with a high yield.

Further, in the first embodiment, the resist 70 restricts the metal film 71 from being formed inside the gas vent groove 14. Since the resist 70 can be formed with high accuracy, it is possible to manufacture the semiconductor devices in which variations in the dimensional accuracy of the metal film 71 are small.

Second Embodiment

Figure 13:
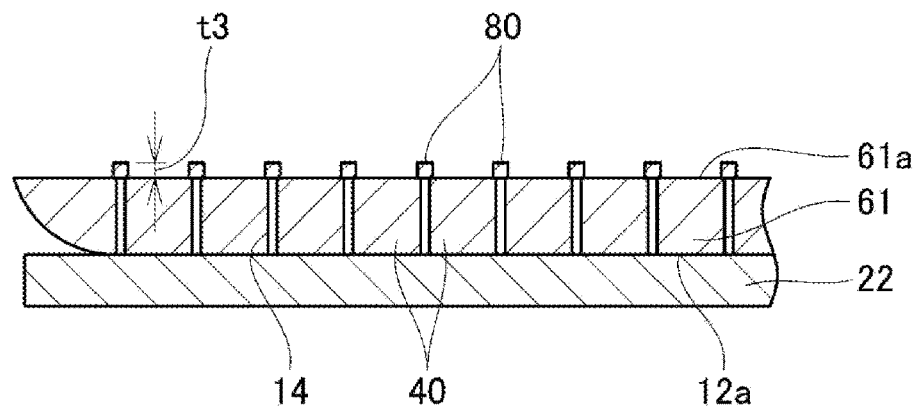
FIG. 13 is a cross-sectional view for explaining a process of forming an electrode in a second embodiment.

A manufacturing method of the second embodiment is different from the manufacturing method of the first embodiment in the electrode forming process. In the second embodiment, after the GaN substrate 12 is divided into the first part 61 and the second part 62, a mask 80 is arranged, first, as shown in FIG. 13. In this example, the mask 80 is arranged so as to cover the inside of the gas vent groove 14 and the peripheral portion 40a of the gas vent groove 14 on the divided surface 61a, similar to FIG. 9. The mask 80 is not formed at the central portion 40b of each device region 40 on the divided surface 61a. In this case, the mask 80 having a third thickness t3, which is the height from the divided surface 61a to the upper surface of the mask 80, is arranged.

Figure 14:
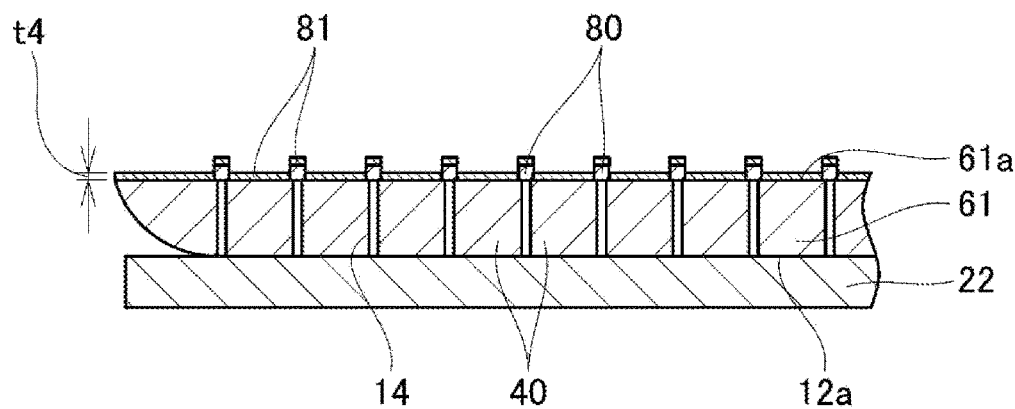
FIG. 14 is a cross-sectional view for explaining the process of forming the electrode in the second embodiment.

Next, as shown in FIG. 14, a metal film 81 is formed to cover the divided surface 61a and the mask 80. The metal film 81 can be formed by a known method such as sputtering or vapor deposition. In this example, the metal film 81 is formed to have a fourth thickness t4 that is smaller than the third thickness t3 of the mask 80. Since the fourth thickness t4 is smaller than the third thickness t3, the metal film 81 formed on the upper surface of the mask 80 is separated from the metal film 81 formed on the divided surface 61a.

Figure 15:
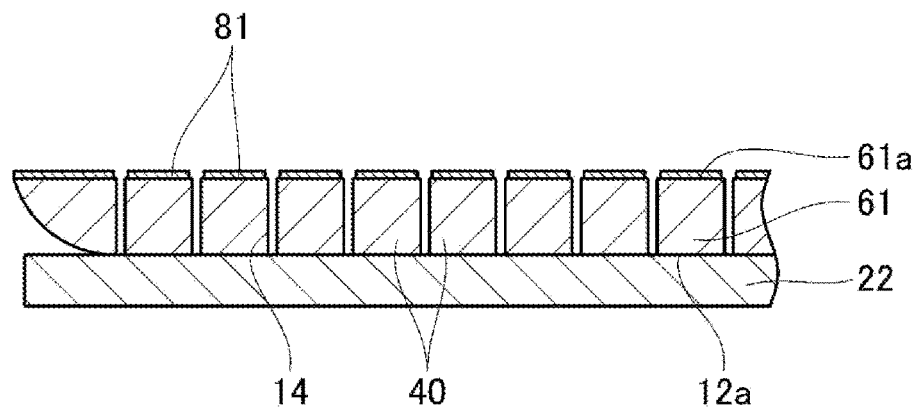
FIG. 15 is a cross-sectional view for explaining the process of forming the electrode in the second embodiment.

Next, as shown in FIG. 15, the mask 80 is removed. Since the metal film 81 formed on the upper surface of the mask 80 has been separated from the metal film 81 formed on the divided surface 61a, the metal film 81 remains on the divided surface 61a when the mask 80 is removed. Each metal film 81 remaining on the divided surface 61a serves as an electrode of the semiconductor device. Thereafter, the similar processes to those of the first embodiment are performed, and thus the multiple semiconductor devices are produced.

In the manufacturing method of the second embodiment, the fourth thickness t4 of the metal film 81 is smaller than the third thickness t3 of the mask 80 in the peripheral portion 40a of the gas vent groove 14. Therefore, the metal film 81 covering the upper surface of the mask 80 can be separated from the metal film 81 covering the divided surface 61a. As such, the metal film 81 formed on the upper surface of the mask 80 can be removed together with the mask 80, which is so-called mask removal. Thus, it is possible to suppress the metal film 81 from being formed inside the gas vent groove 14.

In the second embodiment, the mask 80 restricts the formation of the metal film 81 inside the gas vent groove 14. Since the mask 80 is only positioned so as to cover the gas vent groove 14 and the peripheral portion 40a of the vent groove 14 on the divided surface 61a, it is possible to physically remove the mask. Accordingly, in the second embodiment, the semiconductor device can be manufactured regardless of the material of the metal film 81.

Third Embodiment

Figure 16:
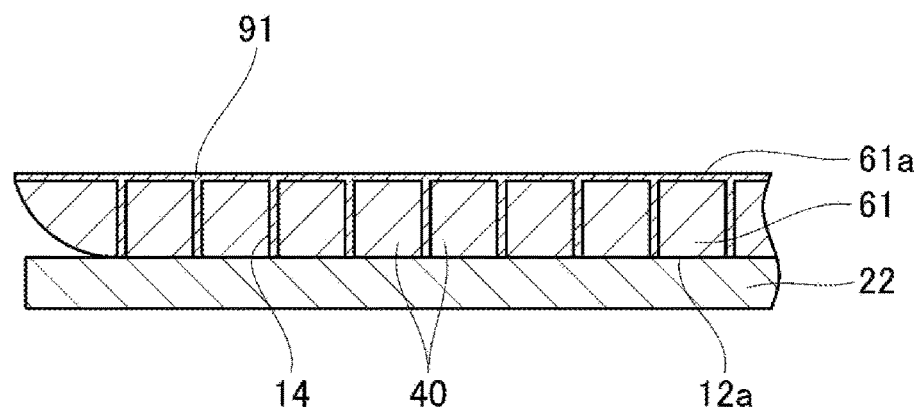
FIG. 16 is a cross-sectional view for explaining a process of forming an electrode in a third embodiment.

A manufacturing method of the third embodiment is different from the manufacturing methods of the first and second embodiments in the electrode forming process. In the third embodiment, after the GaN substrate 12 is divided into the first part 61 and the second part 62, as shown in FIG. 16, a metal film 91 is firstly formed so as to cover a divided surface 61a and a gas vent groove 14. In this example, the metal film 91 is formed in a range extending from the inside of the gas release-vent groove 14 to the entire divided surface 61a. The metal film 91 can be formed by a known method such as sputtering or vapor deposition.

Figure 17:
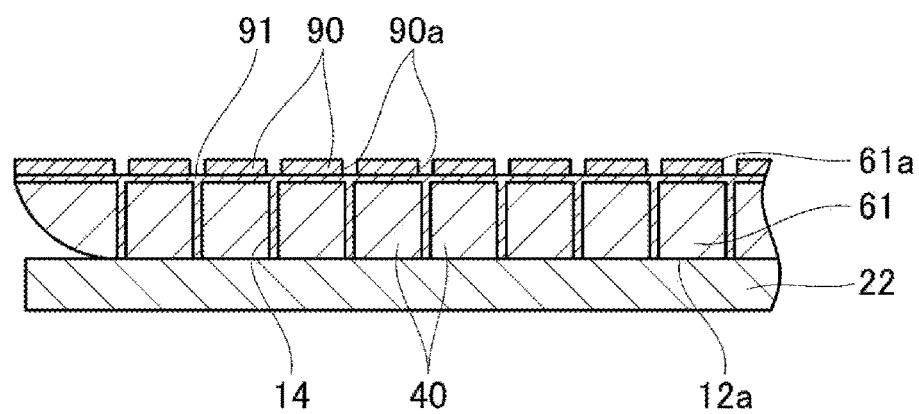
FIG. 17 is a cross-sectional view for explaining the process of forming the electrode in the third embodiment.
Figure 18:
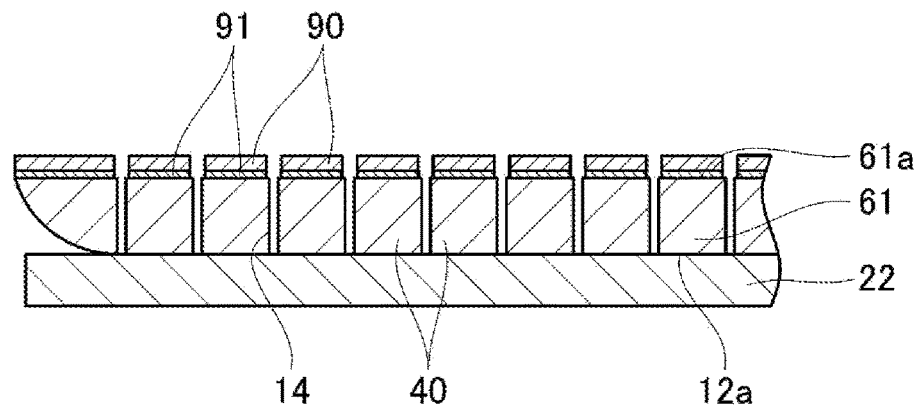
FIG. 18 is a cross-sectional view for explaining the process of forming the electrode in the third embodiment.

Next, as shown in FIG. 17, a resist 90 having an opening 90a above the gas vent groove 14 and the peripheral portion 40a of the gas vent groove 14 (see FIG. 9 of the first embodiment) is formed on the surface of the metal film 91. That is, the resist 90 is formed on the upper surface of the metal film 91, selectively in a range only above the central portion 40b of the device region 40. Then, as shown in FIG. 18, the metal film 91 inside the gas vent groove 14 is removed through the resist 90 by, for example, dry etching or wet etching. Thereafter, the resist 90 is removed and the similar processes to those of the first embodiment are performed. As a result, the multiple semiconductor devices are produced.

In the manufacturing method of the third embodiment, after the metal film 91 is formed entirely above the divided surface 61a and inside of the gas vent groove 14, the metal film 91 inside the gas vent groove 14 is removed through the resist 90. As a result, the gas vent groove 14 can be exposed. In the third embodiment, the metal film 91 inside the gas vent groove 14 is removed through the resist 90. Since the resist 90 can be formed with high accuracy, it is possible to manufacture semiconductor devices in which the variations in dimensional accuracy of the metal film 91 is small.

Figure 19:
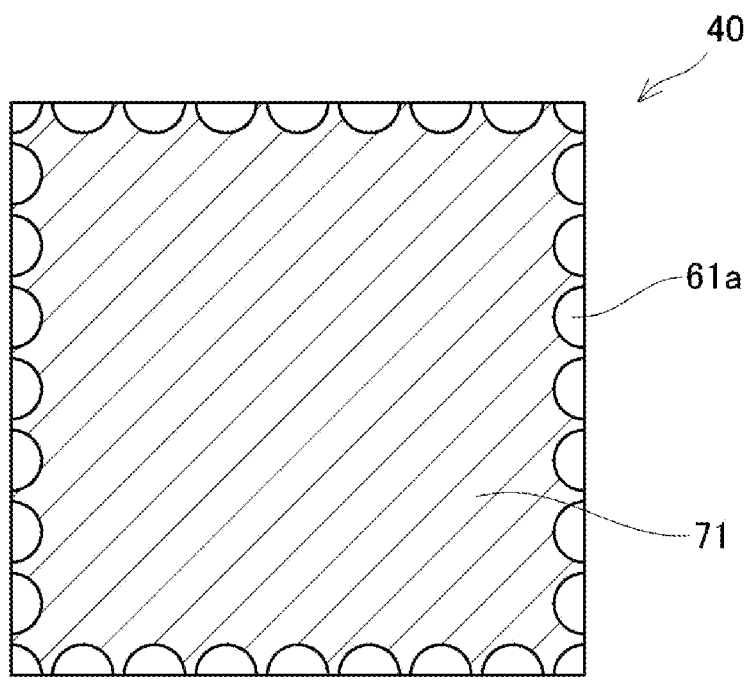
FIG. 19 is a plan view of a semiconductor device manufactured by a manufacturing method in a modified embodiment, when viewed from the bottom.

In each of the embodiments described above, the groove extending along the interfaces between the device regions 40 is formed as the gas vent groove 14 in the gas vent recess forming process. The gas vent groove 14 corresponds to a gas vent recess. However, in the gas vent recess forming process, for example, holes may be intermittently formed along the interfaces of the device regions 40, as gas vent recesses. That is, multiple gas vent holes may be formed at predetermined intervals in the first surface 12a of the GaN substrate 12 along the interfaces of the device regions 40. In this case, after the metal film is formed, the first part 61 can be separated into individual device regions 40 by being diced along the interfaces of the device regions 40. In a semiconductor device obtained by a manufacturing method of a modified embodiment, as shown in FIG. 19, the divided surface 61a is partially exposed at the peripheral edge portion of the device region 40 with shapes corresponding to the shape of the gas vent hole, such as a circular shape.

In each of the embodiments described above, the GaN substrate 12 is used. However, the semiconductor device may be manufactured using a compound semiconductor substrate, such as a gallium oxide substrate, other than the GaN substrate.

Although the embodiments have been described in detail hereinabove, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve multiple objectives at the same time, and achieving one of the objectives itself has technical usefulness.

What is claimed is:

1. A manufacturing method of a semiconductor device, comprising:
    forming a gas vent recess in a first surface of a compound semiconductor substrate, which includes a plurality of device regions adjacent to the first surface, along an interface between the plurality of device regions;
    forming an altered layer inside the compound semiconductor substrate to extend along the first surface at a depth corresponding to a range of a depth of the gas vent recess by applying a laser beam to the compound semiconductor substrate;
    dividing the compound semiconductor substrate at the altered layer into a first part including the first surface and a second part including a second surface of the compound semiconductor substrate opposite to the first surface; and
    forming a metal film covering a divided surface of the first part while exposing the gas vent recess and a peripheral portion of the gas vent recess on the divided surface, wherein
    the divided surface of the first part is a surface separated from the second part when the first part and the second part are divided and is opposite to the first surface of the compound semiconductor substrate in a thickness direction, and
    the forming of the metal film includes:
        forming a resist to cover an inner surface of the gas vent recess and the peripheral portion of the gas vent recess on the divided surface, the resist having a first thickness on the peripheral portion;
        arranging the metal film to cover the divided surface and the resist, the metal film having a second thickness smaller than the first thickness of the resist; and
        after the arranging of the metal film having the second thickness, removing the resist.

2. The manufacturing method according to claim 1, wherein
    the compound semiconductor substrate is made of gallium nitride or gallium oxide.

3. The manufacturing method according to claim 1, wherein
    the arranging of the metal film to cover the divided surface and the resist is performed after the forming of the resist.

4. A manufacturing method of a semiconductor device, comprising:
    forming a gas vent recess in a first surface of a compound semiconductor substrate, which includes a plurality of device regions adjacent to the first surface, along an interface between the plurality of device regions;
    forming an altered layer inside the compound semiconductor substrate to extend along the first surface at a depth corresponding to a range of a depth of the gas vent recess by applying a laser beam to the compound semiconductor substrate;
    dividing the compound semiconductor substrate at the altered layer into a first part including the first surface and a second part including a second surface of the compound semiconductor substrate opposite to the first surface; and
    forming a metal film covering a divided surface of the first part while exposing the gas vent recess and a peripheral portion of the gas vent recess on the divided surface, the divided surface of the first part being a surface divided from the second part and being opposite to the first surface of the compound semiconductor substrate in a thickness direction, wherein
    the forming of the metal film includes:
        arranging a mask to cover the gas vent recess and the peripheral portion of the gas vent recess on the divided surface, the mask having a third thickness;
        arranging the metal film to cover the divided surface and the mask, the metal film having a fourth thickness smaller than the third thickness of the mask; and
        after the arranging of the metal film having the fourth thickness, removing the mask.

5. The manufacturing method according to claim 4, wherein
    the compound semiconductor substrate is made of gallium nitride or gallium oxide.

6. The manufacturing method according to claim 4, wherein
    the arranging of the metal film to cover the divided surface and the mask is performed after the arranging of the mask.

7. A manufacturing method of a semiconductor device, comprising:
    forming a gas vent recess in a first surface of a compound semiconductor substrate, which includes a plurality of device regions adjacent to the first surface, along an interface between the plurality of device regions;
    forming an altered layer inside the compound semiconductor substrate to extend along the first surface at a depth corresponding to a range of a depth of the gas vent recess by applying a laser beam to the compound semiconductor substrate;
    dividing the compound semiconductor substrate at the altered layer into a first part including the first surface and a second part including a second surface of the compound semiconductor substrate opposite to the first surface; and
    forming a metal film covering a divided surface of the first part while exposing the gas vent recess and a peripheral portion of the gas vent recess on the divided surface, wherein
    the divided surface of the first part is a surface separated from the second part when the first part and the second part are divided and is opposite to the first surface of the compound semiconductor substrate in a thickness direction,
    the forming of the metal film includes:
        arranging the metal film to cover the divided surface and the gas vent recess;

forming a resist on a surface of the metal film, the resist defining an opening above the gas vent recess and the peripheral portion of the gas vent recess; and removing the metal film from an inside of the gas vent recess and the peripheral portion of the gas vent recess on the divided surface through the resist.

8. The manufacturing method according to claim 7, wherein the compound semiconductor substrate is made of gallium nitride or gallium oxide.

9. The manufacturing method according to claim 7, wherein the forming of the resist on the surface of the metal film is performed after the arranging of the metal film.

* * * * *